United States Patent
Li

(10) Patent No.: US 12,432,900 B2
(45) Date of Patent: Sep. 30, 2025

(54) METHOD FOR FORMING THREE-DIMENSIONAL SEMICONDUCTOR STRUCTURE AND SEMICONDUCTOR STRUCTURE MADE THEREOF

(71) Applicant: Changxin Memory Technologies, Inc., Anhui (CN)

(72) Inventor: Xiaojie Li, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 441 days.

(21) Appl. No.: 18/093,779

(22) Filed: Jan. 5, 2023

(65) Prior Publication Data

US 2023/0389265 A1   Nov. 30, 2023

Related U.S. Application Data

(63) Continuation of application No. PCT/CN2022/115021, filed on Aug. 26, 2022.

(30) Foreign Application Priority Data

May 30, 2022  (CN) .......................... 202210614481.X

(51) Int. Cl.
H10B 12/00   (2023.01)

(52) U.S. Cl.
CPC ............. *H10B 12/03* (2023.02); *H10B 12/05* (2023.02); *H10B 12/482* (2023.02)

(58) Field of Classification Search
CPC ...... H10B 12/03; H10B 12/05; H10B 12/482; H01L 23/532
See application file for complete search history.

(56) References Cited

U.S. PATENT DOCUMENTS 9,589,982 B1    3/2017  Cheng et al.
10,861,854 B2  12/2020  Kim et al.
(Continued)

FOREIGN PATENT DOCUMENTS

CN   113130494 A   7/2021
CN   113206092 A   8/2021
(Continued)

OTHER PUBLICATIONS

PCT International Search Report and the Written Opinion mailed Dec. 19, 2022, issued in related International Application No. PCT/CN2022/115021, with English translation (18 pages).
(Continued)

*Primary Examiner* — Ratisha Mehta
*Assistant Examiner* — Sophia W Kao
(74) *Attorney, Agent, or Firm* — Sheppard Mullin Richter & Hampton LLP

(57) ABSTRACT

This invention relates to a semiconductor structure and a method for forming the semiconductor structure. The method for forming a semiconductor structure includes the following steps: forming a stacking layer on a top surface of a substrate, where the stacking layer includes a plurality of semiconductor layers arranged at intervals in a first direction, and the stacking layer includes a transistor region, a capacitor region, and a bit line region, where the semiconductor layers include semiconductor columns arranged at intervals in a third direction; forming, in the capacitor region, a capacitor extending in the second direction; forming a word line in the transistor region, where the word line extends in the third direction and continuously covers the semiconductor columns arranged at intervals in the third direction; and forming a bit line in the bit line region, where the bit line extends in the first direction.

16 Claims, 15 Drawing Sheets

(56) References Cited

U.S. PATENT DOCUMENTS

| | | |
|---|---|---|
| 2016/0365351 A1 | 12/2016 | Nishikawa et al. |
| 2017/0047377 A1 | 2/2017 | Lai et al. |
| 2018/0323199 A1* | 11/2018 | Roberts ................ H10D 64/518 |
| 2020/0111793 A1* | 4/2020 | Kim ........................ H10D 88/00 |
| 2021/0028184 A1 | 1/2021 | Kim |
| 2021/0242210 A1 | 8/2021 | Lee |
| 2021/0257366 A1* | 8/2021 | Lee ........................ H10B 12/50 |
| 2022/0013524 A1* | 1/2022 | Ryu ........................ H10D 86/80 |
| 2022/0085023 A1* | 3/2022 | Shin ........................ H10B 12/03 |
| 2022/0115378 A1* | 4/2022 | Lee ........................ H10B 12/09 |
| 2022/0238527 A1 | 7/2022 | Choi |
| 2022/0352170 A1* | 11/2022 | Lee ........................ H10B 12/03 |
| 2023/0015279 A1* | 1/2023 | Shao ...................... H10B 12/033 |
| 2023/0309290 A1 | 9/2023 | Choi |
| 2023/0389263 A1* | 11/2023 | Li ........................... H10B 12/03 |

FOREIGN PATENT DOCUMENTS

| | | |
|---|---|---|
| CN | 113284897 A | 8/2021 |
| CN | 113903741 A | 1/2022 |
| CN | 114121819 A | 3/2022 |
| TW | 201711138 A | 3/2017 |
| TW | 202125771 A | 7/2021 |

OTHER PUBLICATIONS

Search Report dated Mar. 21, 2024, issued in related Taiwan Application No. 112119332, with English machine translation (3 pages).

Extended European Search Report dated May 2, 2025, issued in related European Patent Application No. 22944507.7 (9 pages).

* cited by examiner

METHOD FOR FORMING THREE-DIMENSIONAL SEMICONDUCTOR STRUCTURE AND SEMICONDUCTOR STRUCTURE MADE THEREOF

CROSS REFERENCE TO RELATED APPLICATIONS

This application is a continuation application of International Patent Application No. PCT/CN2022/115021, filed on Aug. 26, 2022, which claims priority to Chinese Patent Application No. 202210614481.X, filed on May 30, 2022 and entitled "SEMICONDUCTOR STRUCTURE AND METHOD FOR FORMING SEMICONDUCTOR STRUCTURE." The above-referenced applications are incorporated herein by reference in their entirety.

TECHNICAL FIELD

This invention relates to the field of semiconductor manufacturing technologies, and in particular, to a semiconductor structure and a method for forming the semiconductor structure.

BACKGROUND

Dynamic random access memory (DRAM) is a semiconductor apparatus commonly used in electronic devices such as computers, and consists of a plurality of storage units, each of which usually includes a transistor and a capacitor. A gate of the transistor is electrically connected to a word line, a source is electrically connected to a bit line, and a drain is electrically connected to the capacitor. Word line voltage applied on the word line can control on and off of the transistor, so that the bit line can be used to read data stored in the capacitor or write data into the capacitor.

DRAM and other semiconductor structures mostly are two-dimensional structures, resulting in low storage density and integration of the semiconductor structure, which can hardly meet the requirements of semiconductor storage capacity in different fields.

Therefore, increasing integration of the semiconductor structure to improve the performance of the semiconductor structure is an urgent technical problem to be resolved.

SUMMARY

A semiconductor structure and a method for forming the semiconductor structure are provided in some embodiments of this invention to mitigate the problem of relatively low integration of a semiconductor structure, so as to improve the performance of the semiconductor structure and expand the application field of the semiconductor structure.

According to some embodiments, this invention provides a method for forming a semiconductor structure, including the following steps: forming a stacking layer on a top surface of a substrate, where the stacking layer includes a plurality of semiconductor layers arranged at intervals in a first direction, and the stacking layer includes a transistor region, a capacitor region distributed on two opposite sides of the transistor region in a second direction, and a bit line region, where the semiconductor layers include semiconductor columns arranged at intervals in a third direction, where the first direction is perpendicular to the top surface of the substrate, both of the second direction and the third direction are parallel to the top surface of the substrate, and the second direction intersects the third direction; forming, in the capacitor region, a capacitor extending in the second direction; forming a word line in the transistor region, where the word line extends in the third direction and continuously covers the semiconductor columns arranged at intervals in the third direction; and forming a bit line in the bit line region, where the bit line extends in the first direction and is electrically connected to the semiconductor columns arranged at intervals in the first direction.

According to some other embodiments, this invention further provides a semiconductor structure formed by using the method for forming a semiconductor structure according to any of the foregoing embodiments.

According to the semiconductor structure and the method for forming the semiconductor structure provided in this invention, the stacking layer is formed on the top surface of the substrate. The stacking layer includes a plurality of semiconductor layers arranged at intervals in a direction perpendicular to the top surface of the substrate, and each semiconductor layer includes a plurality of semiconductor columns arranged at intervals in a direction parallel to the top surface of the substrate, so that the plurality of semiconductor columns in the stacking layer are stacked in a three-dimensional array. Subsequently, a horizontal capacitor, a horizontal word line, and a vertical bit line are formed to convert a conventional two-dimensional semiconductor structure into a three-dimensional semiconductor structure. In this way, storage density of the semiconductor structure can be increased and performance of the semiconductor structure can be improved while integration of the semiconductor structure is improved. In addition, in this invention, two transistors can share one bit line, which further helps reduce the size of the semiconductor structure and improve the storage capacity of the semiconductor structure.

DESCRIPTION OF EMBODIMENTS

Embodiments of the semiconductor structure and the method for forming the semiconductor structure provided in this invention are described below in detail with reference to the accompanying drawings.

Figure 1:
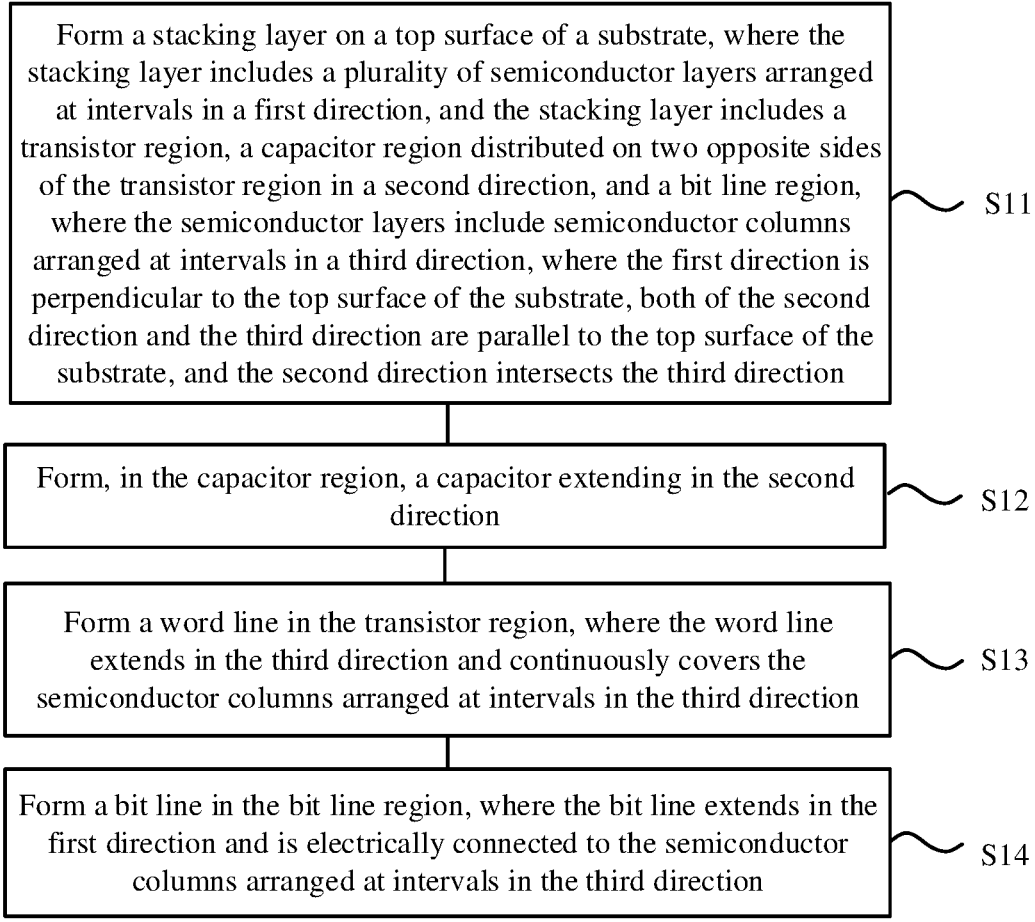
FIG. 1 is a flowchart of a method for forming a semiconductor structure according to an embodiment of this invention.

An embodiment provides a method for forming a semiconductor structure. FIG. 1 is a flowchart of a method for forming a semiconductor structure according to an embodiment of this invention. FIG. 2 to FIG. 23 are schematic diagrams of main structures in a process of forming a semiconductor structure according to various embodiments of this invention. The semiconductor structure provided in these embodiments may be but is not limited to a DRAM. As shown in FIG. 1 to FIG. 23, the method for forming a semiconductor structure includes the following steps.

Figure 5:
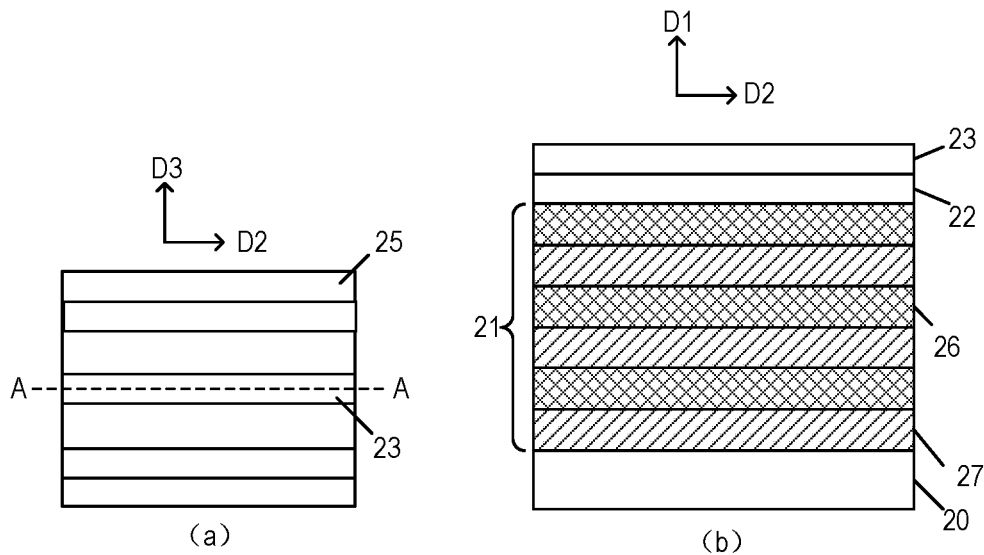

Step S11: Form a stacking layer 21 on a top surface of a substrate 20, where the stacking layer 21 includes a plurality of semiconductor layers 212 arranged at intervals in a first direction D1, and the stacking layer 21 includes a transistor region, a capacitor region distributed on two opposite sides of the transistor region in a second direction D2, and a bit line region. The semiconductor layers 212 include semiconductor columns 26 arranged at intervals in a third direction D3. The first direction D1 is perpendicular to the top surface of the substrate 20, both of the second direction D2 and the third direction D3 are parallel to the top surface of the substrate 20, and the second direction D2 intersects the third direction D3. As shown in FIG. 5, image (a) of FIG. 5 is a schematic top view of a semiconductor structure, and image (b) of FIG. 5 is a schematic cross-sectional diagram of image (a) of FIG. 5 along AA direction.

In some embodiments, the substrate 20 may be but is not limited to a silicon substrate. Some embodiments are described by using an example in which the substrate 20 is a silicon substrate. In some other embodiments, the substrate 20 may be a semiconductor substrate such as gallium nitride, gallium arsenide, gallium carbide, silicon carbide, or SOI. The substrate 20 is configured to support a semiconductor component above the substrate 20. The top surface of the substrate 20 refers to a surface of the substrate 20 used to form the stacking layer 21.

Figure 2:
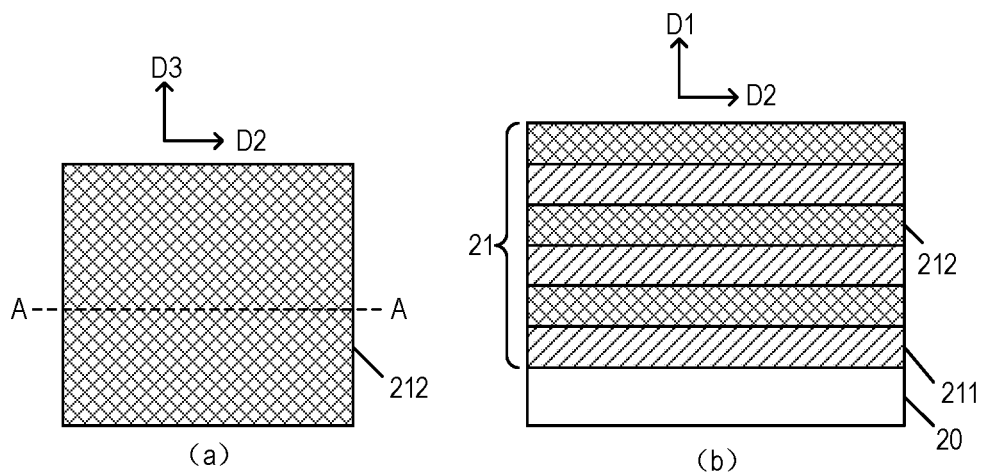
FIG. 2 to FIG. 23 are schematic diagrams of main structures in a process of forming a semiconductor structure according to various embodiments of this invention.

In some embodiments, the step of forming a stacking layer 21 on a top surface of a substrate 20 includes: alternately depositing the semiconductor layer 212 and a first sacrificial layer 211 on the top surface of the substrate 20 in the first direction D1 to form the stacking layer 21 as shown in FIG. 2, where image (a) of FIG. 2 is a schematic top view of a semiconductor structure, and image (b) of FIG. 2 is a schematic cross-sectional diagram of image (a) of FIG. 2 along AA direction; and etching the stacking layer 21 to form a first trench 25 exposing the substrate 20, where the first trench 25 separates the semiconductor layers 212 into the semiconductor columns 26 arranged at intervals in the third direction D3, as shown in FIG. 5.

In some embodiments, the first sacrificial layer 211 and the semiconductor layer 212 may be alternately formed on the top surface of the substrate 20 in the first direction D1 in an epitaxial growth manner, to form the stacking layer 21, as shown in FIG. 2. A person skilled in the art may select, based on an actual requirement, a specific number of first sacrificial layers 211 and semiconductor layers 212 that are alternately deposited in the stacking layer 21. The more first sacrificial layers 211 and semiconductor layers 212 are alternately deposited in the stacking layer 21, the greater storage capacity of the semiconductor structure is formed. In some embodiments, the material of the semiconductor layer 212 is a silicon material doped with ions, and the material of the first sacrificial layer 211 is silicon germanium. The doped ions may be but are not limited to phosphorus ions. By forming the semiconductor layer 212 using silicon material doped with ions, ions do not need to be doped when a channel region, a source region, and a drain region in the transistor are subsequently formed, thereby simplifying the forming process of the semiconductor structure. There is a relatively high etching selection ratio between the silicon material doped with ions and the silicon germanium material, so that the first sacrificial layer 211 is selectively removed subsequently without causing damage to the semiconductor layer 212.

Figure 3:
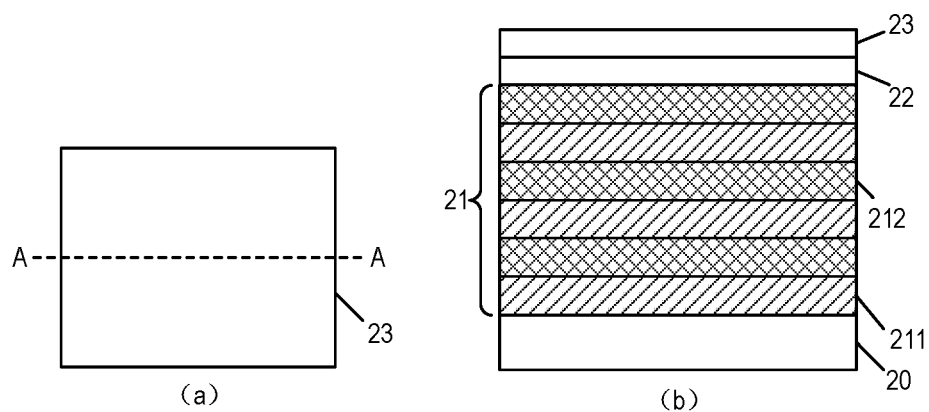

Then, a second sacrificial layer is deposited on the top surface of the stacking layer 21. The second sacrificial layer may have a single-layer structure or may have a multi-layer structure. In an embodiment, the second sacrificial layer includes a first pad layer 22 covering the top surface of the stacking layer 21 and a second pad layer 23 located on a top surface of the first pad layer 22. As shown in FIG. 3, image (a) of FIG. 3 is a schematic top view of a semiconductor structure, and (b) FIG. 3 is a schematic cross-sectional diagram of image (a) of FIG. 3 along AA direction. The material of the first pad layer 22 may be but is not limited to an oxide material (such as silicon dioxide), and the material of the second pad layer 23 may be but is not limited to a nitride material (such as silicon nitride). "A plurality of" used in this embodiment refers to "more than two".

Figure 4:
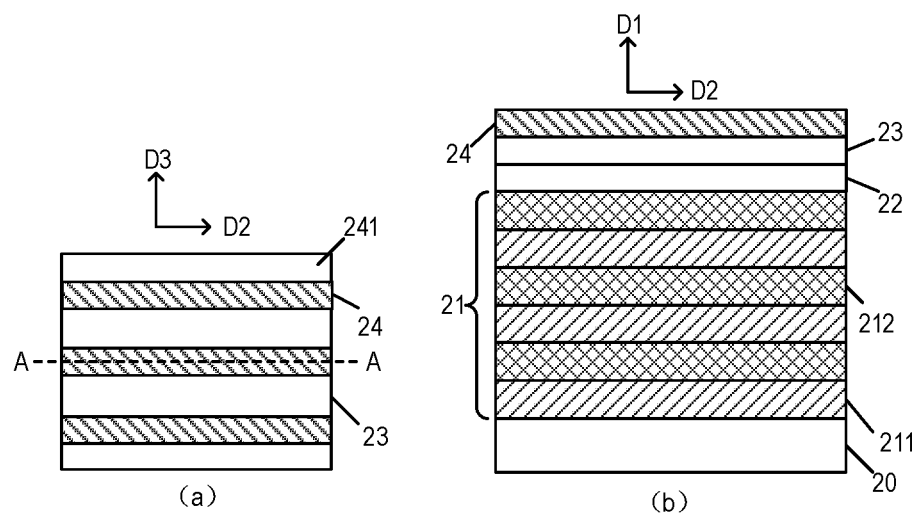

A patterned first photoresist layer 24 is formed on a surface of the second pad layer 23, and the first photoresist layer 24 has a first etching window 241 exposing the second pad layer 23. As shown in FIG. 4, image (a) of FIG. 4 is a schematic top view of a semiconductor structure, and image (b) of FIG. 4 is a schematic cross-sectional diagram of image (a) of FIG. 4 along AA direction. The second pad layer 23, the first pad layer 22, and the stacking layer 21 are etched downward along the first etching window 241 to form a plurality of first trenches 25 exposing the substrate 20, and the plurality of first trenches 25 are arranged at intervals in the third direction D3, so that each semiconductor layer 212 is separated into a plurality of semiconductor columns 26 arranged at intervals in the third direction D3, and each first sacrificial layer 211 is separated into a plurality of sacrificial columns 27 arranged at intervals in the third direction D3, as shown in FIG. 5. In one aspect, the first pad layer 22 and the second pad layer 23 are configured to improve a morphology of the first trench. In another aspect, the first pad layer 22 and the second pad layer 23 are further configured to prevent a processing of patterning the first photoresist layer 24 from damaging the semiconductor layer 212 in a topmost layer of the stacking layer 21.

Figure 12:
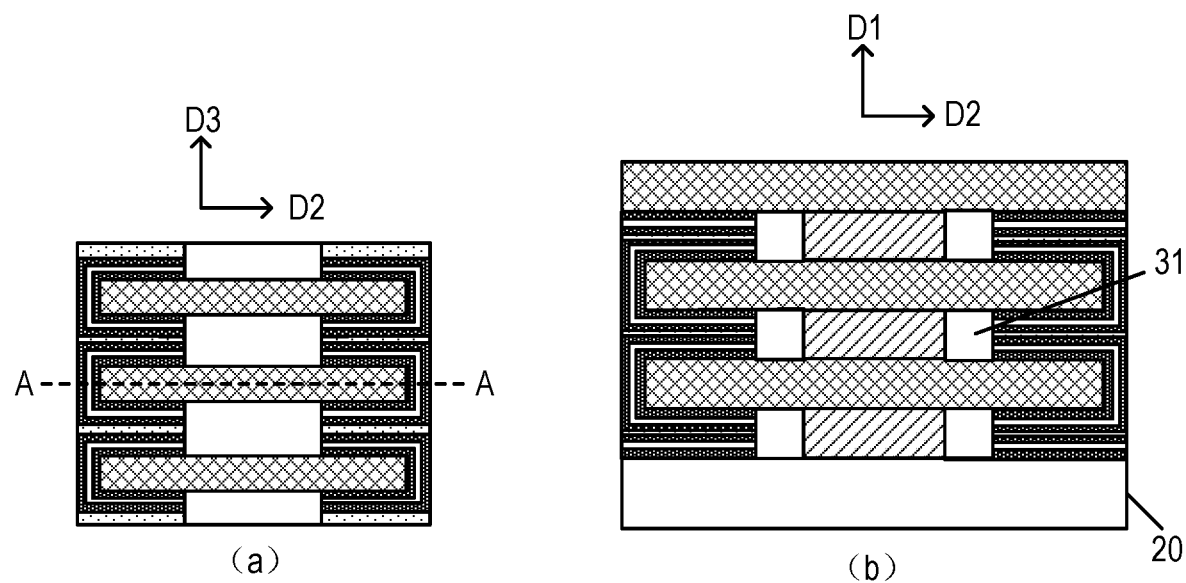

Step S12: Form, in the capacitor region, a capacitor extending in the second direction D2 as shown in FIG. 12. Image (a) of FIG. 12 is a schematic top view of a semiconductor structure, and image (b) of FIG. 12 is a schematic cross-sectional diagram of image (a) of FIG. 12 along AA direction.

Figure 8:
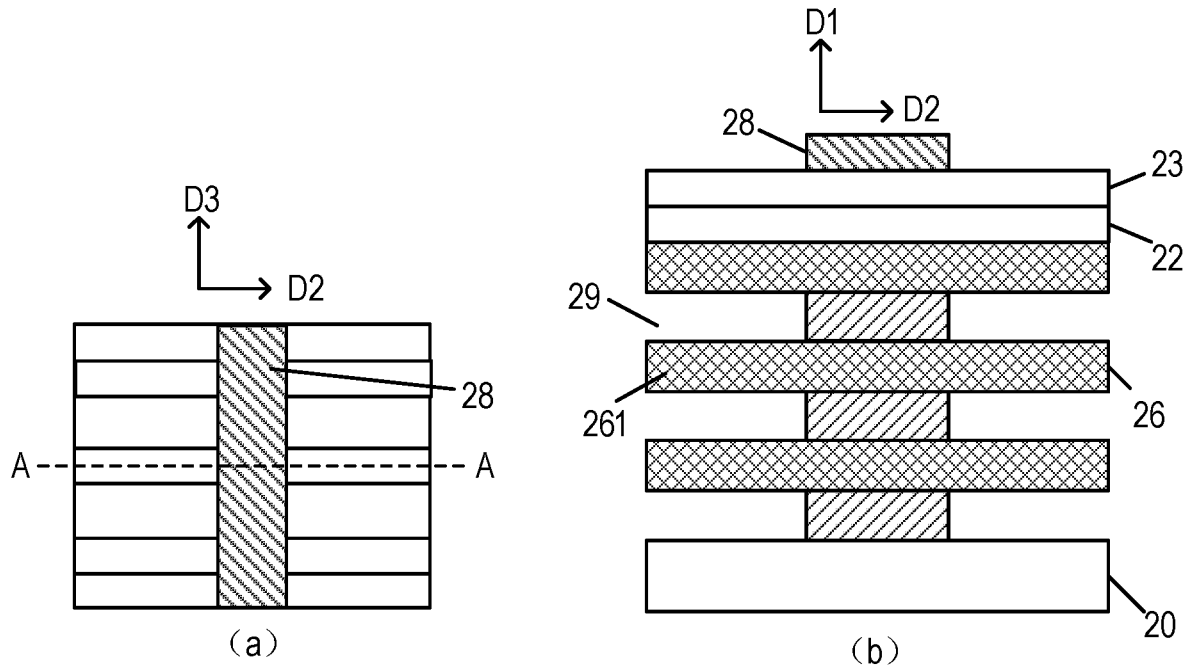

In some embodiments, each semiconductor column 26 includes a conductive column 261 located in the capacitor region, and the step of forming, in the capacitor region, a capacitor extending in the second direction D2 includes: removing the first sacrificial layer 211 in the capacitor region to form a first gap 29 between two adjacent semiconductor layers 212 in the capacitor region as shown in FIG. 8, where image (a) of FIG. 8 is a schematic top view of a semiconductor structure, and image (b) of FIG. 8 is a schematic cross-sectional diagram of image (a) of FIG. 8 along AA direction; forming, in the first gap 29, a conductive layer 301 covering the conductive column 261, a dielectric layer 302 covering the conductive layer 301, an upper electrode layer 303 covering the dielectric layer 302, and a common electrode layer 304 covering the upper electrode layer 303; and forming a capacitor including the conductive column 261, the conductive layer 301, the dielectric layer 302, the upper electrode layer 303, and the common electrode layer 304.

Figure 9:
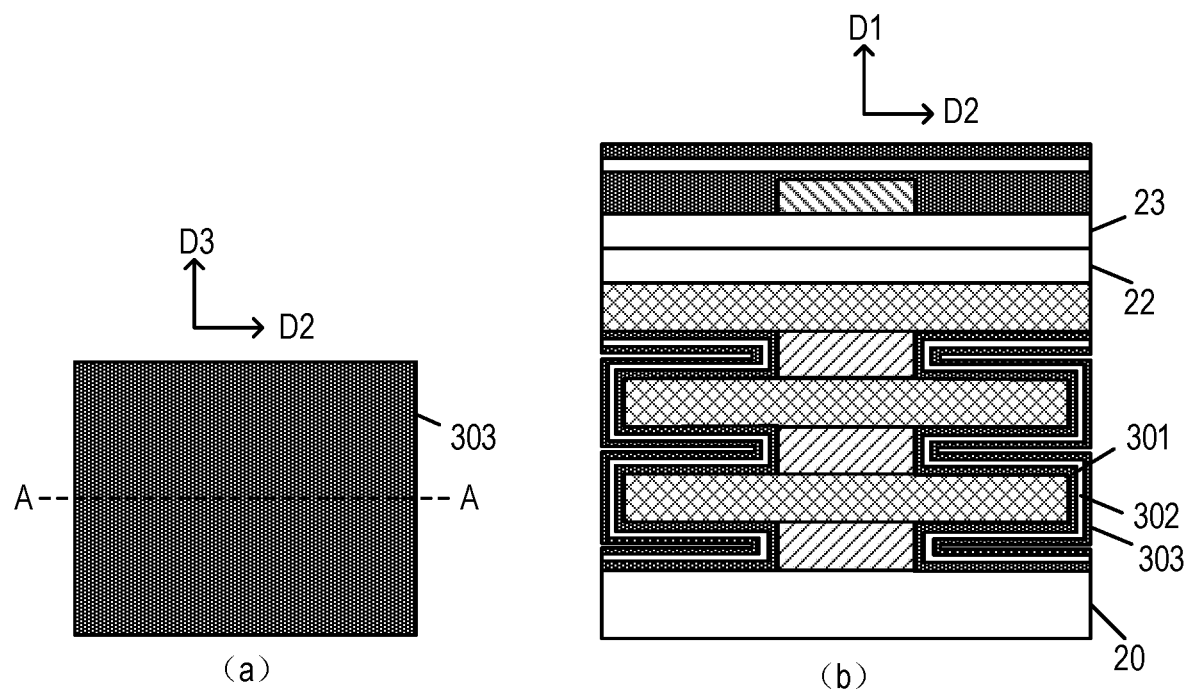
Figure 10:
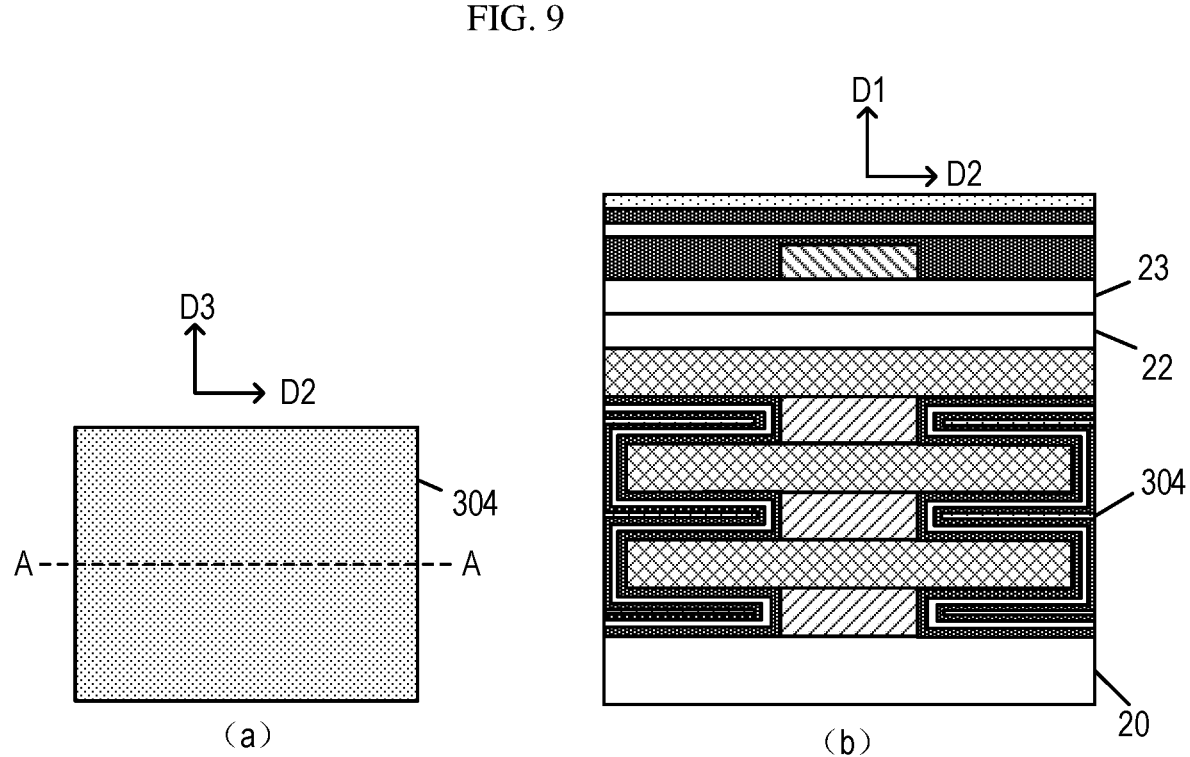

In some embodiments, the step of forming a capacitor including the conductive column 261, the conductive layer 301, the dielectric layer 302, the upper electrode layer 303, and the common electrode layer 304 includes: forming a conductive layer 301 that continuously covers inner walls of the first gaps 29 arranged at intervals in the first direction D1; forming a dielectric layer 302 covering a surface of the conductive layer 301; forming an upper electrode layer 303 covering a surface of the dielectric layer 302 as shown in FIG. 9, where image (a) of FIG. 9 is a schematic top view of a semiconductor structure, and image (b) of FIG. 9 is a schematic cross-sectional diagram of image (a) of FIG. 9 along AA direction; forming a common electrode layer 304 covering a surface of the upper electrode layer 303 as shown in FIG. 10, where image (a) of FIG. 10 is a schematic top view of a semiconductor structure, and image (b) of FIG. 10 is a schematic cross-sectional diagram of image (a) of FIG. 10 along AA direction; removing the conductive layer 301, the dielectric layer 302, the upper electrode layer 303, and the common electrode layer 304 that cover a sidewall of the first sacrificial layer 211 in the transistor region; and forming a first opening 31 between two adjacent semiconductor layers 212 in the capacitor region, where the conductive column 261, and the conductive layer 301, the dielectric layer 302, the upper electrode layer 303, and the common electrode layer 304 that remain in the first gap 29 form the capacitor, as shown in FIG. 12.

Figure 6:
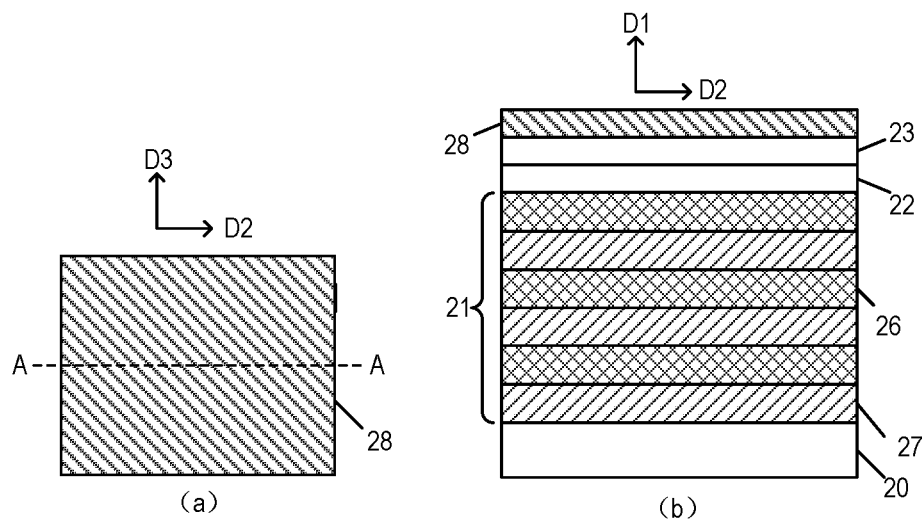
Figure 7:
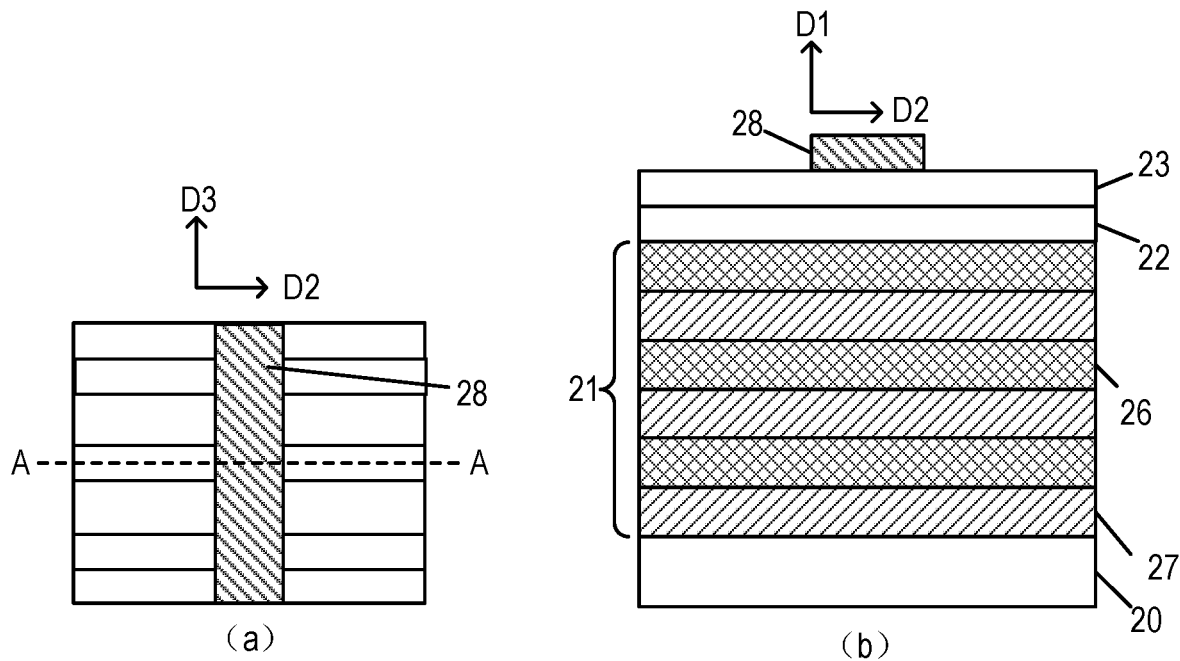

In some embodiments, a third sacrificial layer 28 is formed on the surface of the second pad layer 23 as shown in FIG. 6. Image (a) of FIG. 6 is a schematic top view of a semiconductor structure, and image (b) of FIG. 6 is a schematic cross-sectional diagram of image (a) of FIG. 6 along AA direction. The material of the third sacrificial layer 28 may be but is not limited to an oxide material (such as silicon dioxide). Next, a patterned second photoresist layer is formed on a surface of the third sacrificial layer 28, and the second photoresist layer has a second etching window exposing the third sacrificial layer 28. The third sacrificial layer 28 is etched downward along the second etching window to expose the second pad layer 23 above the transistor region as shown in FIG. 7. Image (a) of FIG. 7 is a schematic top view of a semiconductor structure, and image (b) of FIG. 7 is a schematic cross-sectional diagram of image (a) of FIG. 7 along AA direction. The remaining third sacrificial layer 28 covers stacking layer 21 in the transistor region and the bit line region. Then, the first sacrificial layer 211 in the capacitor region may be removed by using a lateral etching process to form the first gap 29 between two adjacent semiconductor layers 212 in the capacitor region, as shown in FIG. 8. Forming the first gap 29 by using the lateral etching process can simplify the manufacturing process of the semiconductor structure and avoid damage to the stacking layer 21 in the transistor region and the bit line region.

Figure 11:
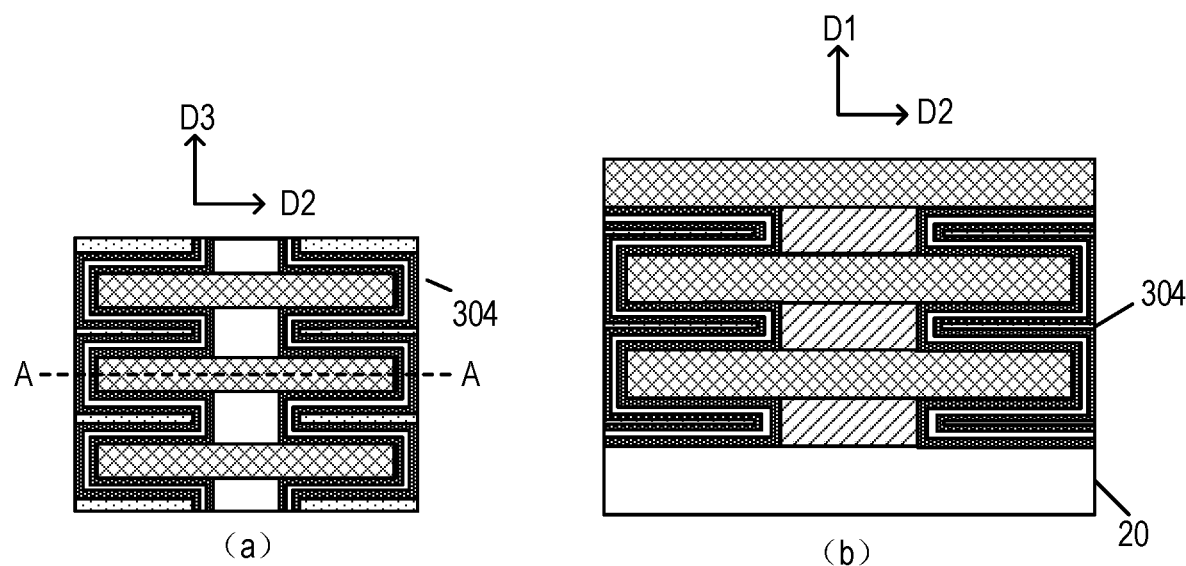

A conductive material such as metal tungsten or TiN is continuously deposited by using a lateral atomic layer deposition process on inner walls of a plurality of first gaps 29 arranged at intervals in the first direction D1, to form the conductive layer 301 that continuously covers surfaces of a plurality of conductive columns 261 arranged at intervals in the first direction D1. Next, a material with a relatively high dielectric constant (HK) is deposited on the surface of the conductive layer 301 to form the dielectric layer 302. A conductive material such as metal tungsten or TiN is deposited on the surface of the dielectric layer 302 to form the upper electrode layer 303, as shown in FIG. 9. A conductive material such as polycrystalline silicon is deposited in the first gap 29 to form the common electrode layer 304 that covers the upper electrode layer 303 and fills the first gap 29, as shown in FIG. 10. A structure shown in FIG. 11 is obtained after the first pad layer 22, the second pad layer 23, the third sacrificial layer 28, the conductive layer 301, the dielectric layer 302, the upper electrode layer 303, and the common electrode layer 304 are removed from the top surface of the stacking layer 21, where image (a) of FIG. 11 is a schematic top view of a semiconductor structure, and image (b) of FIG. 11 is a schematic cross-sectional diagram of image (a) of FIG. 11 along AA direction.

Figure 13:
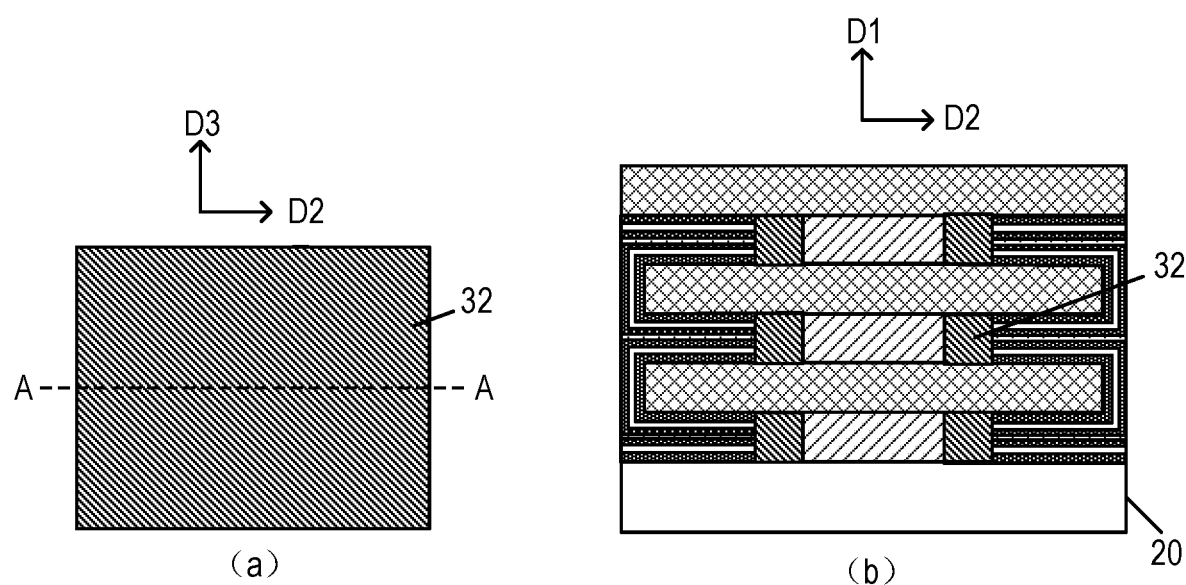

Then, a patterned third photoresist layer is formed above the stacking layer 21, and the third photoresist layer includes a third etching window exposing a portion of the conductive layer 301, the dielectric layer 302, the upper electrode layer 303, and the common electrode layer 304. The conductive layer 301, the dielectric layer 302, the upper electrode layer 303, and the common electrode layer 304 are etched downward along the third etching window, to remove the conductive layer 301, the dielectric layer 302, the upper electrode layer 303, and the common electrode layer 304 that cover the sidewall of the first sacrificial layer 211 in the transistor region, and form the first opening 31 between two adjacent semiconductor layers 212 in the capacitor region, where the conductive column 261, and the conductive layer 301, the dielectric layer 302, the upper electrode layer 303, and the common electrode layer 304 that remain in the first gap 29 form the capacitor, as shown in FIG. 12. The conductive column 261 and the conductive layer 301 jointly serve as a lower electrode layer of the capacitor. An insulating medium material such as an oxide is deposited in the first opening 31 to form a capacitor isolation layer 32. As shown in FIG. 13, image (a) of FIG. 13 is a schematic top view of a semiconductor structure, and image (b) of FIG. 13 is a schematic cross-sectional diagram of image (a) of FIG. 13 along AA direction.

In this embodiment, a length of the first gap 29 in the second direction D2 is greater than a length of the capacitor in the second direction D2, so that the capacitor isolation layer 32 is formed to isolate the capacitor from the transistor region, to prevent a subsequent word line forming process from damaging the formed capacitor.

Figure 18:
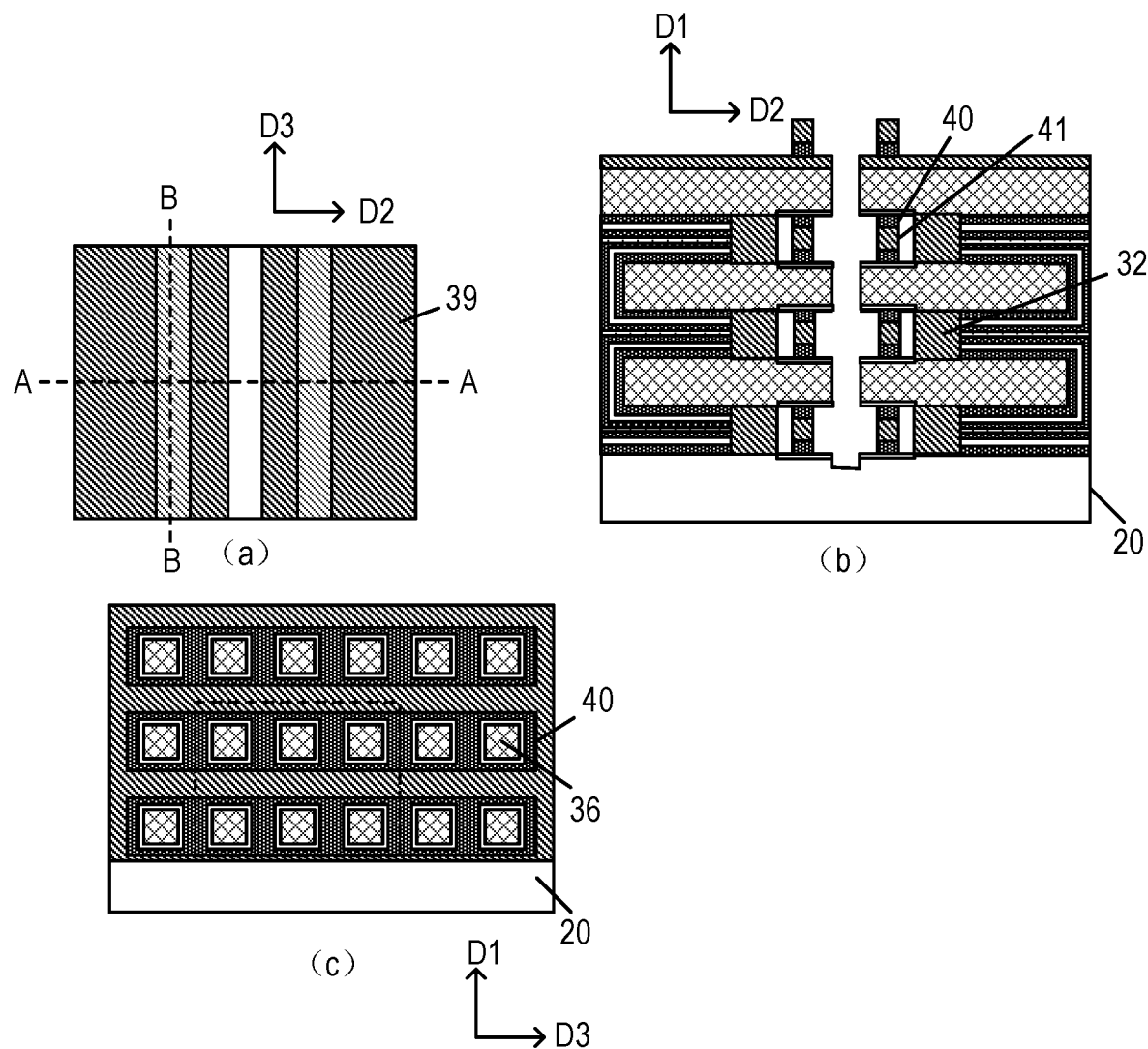

Step S13: Form a word line 40 in the transistor region, where the word line 40 extends in the third direction D3 and continuously covers the semiconductor columns 26 arranged at intervals in the third direction D3 as shown in FIG. 18, where image (a) of FIG. 18 is a schematic top view of a semiconductor structure, image (b) of FIG. 18 is a schematic cross-sectional diagram of image (a) of FIG. 18 along AA direction, and image (c) of FIG. 18 is a schematic cross-sectional diagram of image (a) of FIG. 18 along BB direction.

In some embodiments, each semiconductor column 26 includes an active column 36 located in the transistor region (refer to FIG. 18), the active column 36 includes a channel region, and a source region and a drain region distributed on two opposite sides of the channel region in the second direction D2, the drain region is adjacent to the capacitor region, and the source region is adjacent to the bit line region. The step of forming a word line 40 in the transistor region includes: removing the first sacrificial layer 211 in the transistor region and the stacking layer 21 in the bit line region; forming a second gap 35 exposing at least the channel region in the transistor region and a second trench 34 exposing the substrate 20 in the bit line region as shown in FIG. 15, where image (a) of FIG. 15 is a schematic top view of a semiconductor structure, image (b) of FIG. 15 is a schematic cross-sectional diagram of image (a) of FIG. 15 along AA direction, and image (c) of FIG. 15 is a schematic cross-sectional diagram of image (a) of FIG. 15 along BB direction; and forming, in the second gap 35, the word line 40 that extends in the third direction D3 and continuously covers the channel regions arranged at intervals in the third direction D3, as shown in FIG. 18.

Figure 14:
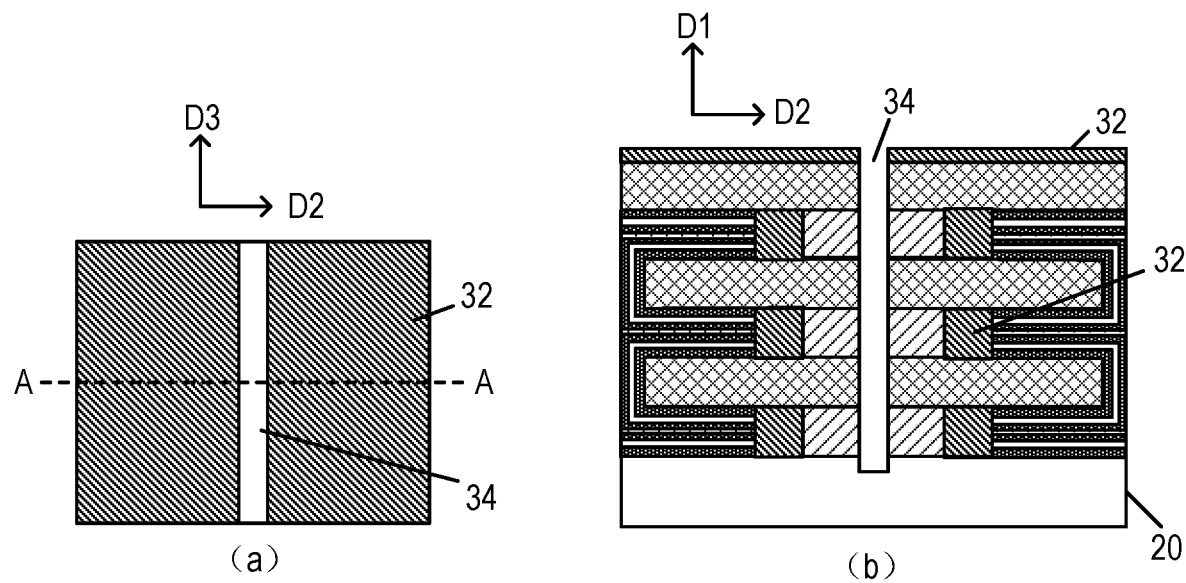
Figure 15:
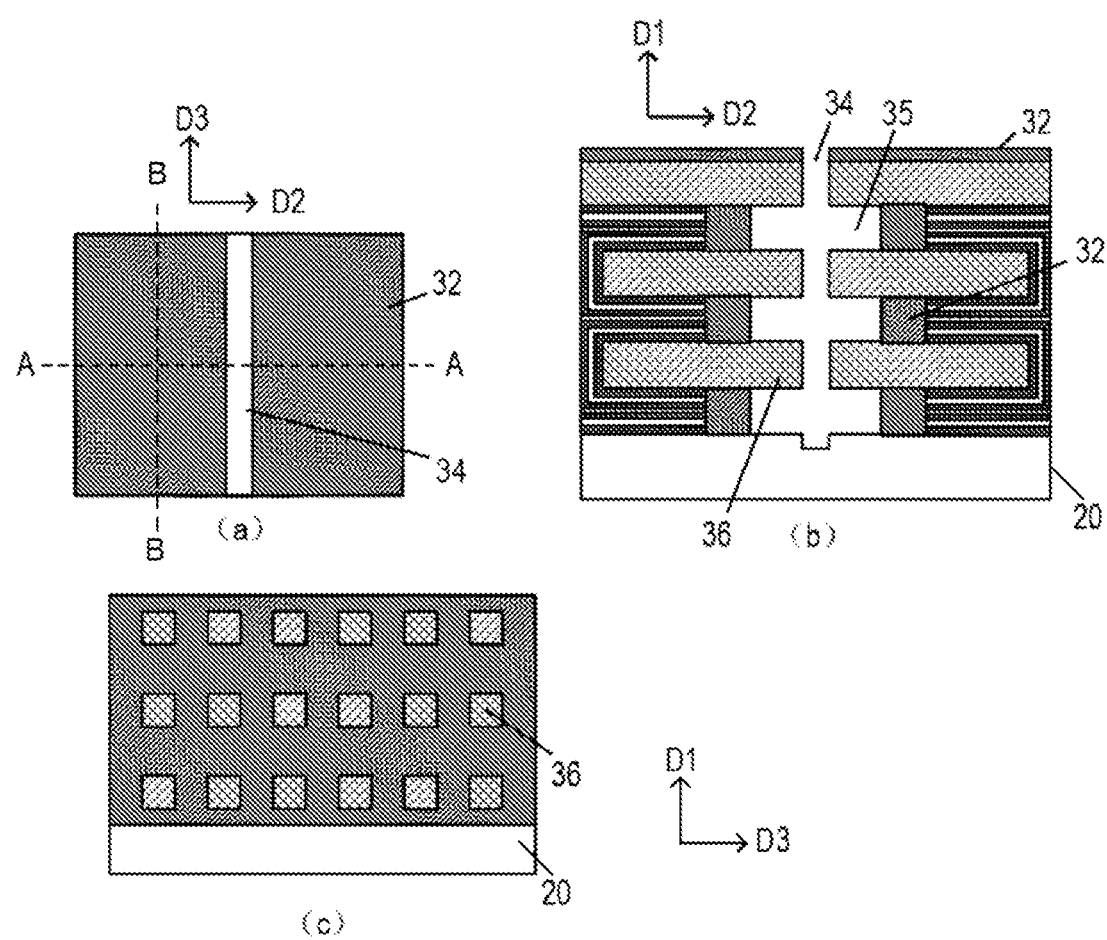

In some embodiments, the step of forming a second gap 35 exposing at least the channel region in the transistor region and a second trench 34 exposing the substrate in the bit line region includes: forming a capacitor isolation layer 32 filling the first opening 31; removing the stacking layer 21 in the bit line region to form the second trench 34 exposing the substrate 20 in the bit line region as shown in FIG. 14, where image (a) of FIG. 14 is a schematic top view of a semiconductor structure, and image (b) of FIG. 14 is a schematic cross-sectional diagram of image (a) of FIG. 14 along AA direction; and removing the first sacrificial layer 211 in the transistor region along the second trench 34 to form, between two adjacent semiconductor layers 212 in the transistor region, the second gap 35 exposing the channel region, the drain region, and the source region, as shown in FIG. 15.

In some embodiments, a bottom of the second trench 34 exposes the top surface of the substrate 20. To be specific, the substrate 20 is configured as an etching stop layer in an etching process, to accurately control an etching endpoint and avoid damage to the substrate 20.

In some other embodiments, the second trench 34 extends to the inside of the substrate 20 to enlarge the area of contact between a bit line subsequently formed in the second trench 34 and the substrate 20.

In some embodiments, the stacking layer 21 includes two transistor regions distributed on two opposite sides of the bit line region in the second direction D2, and one capacitor region is located on a side of the transistor region that is away from the bit line region. The step of removing the first sacrificial layer 211 in the transistor region along the second trench 34 includes: simultaneously removing the first sacrificial layers 211 in the two transistor regions along the second trench 34.

In some embodiments, one bit line region is disposed in the stacking layer 21, and one transistor region is disposed on each of the two opposite sides of the bit line region in the second direction D2, and one capacitor region is disposed on the side of the transistor region that is away from the bit line region, so that two subsequently formed transistors can share one bit line, thereby further reducing the size of the semiconductor structure and improving integration of the semiconductor structure.

Figure 16:
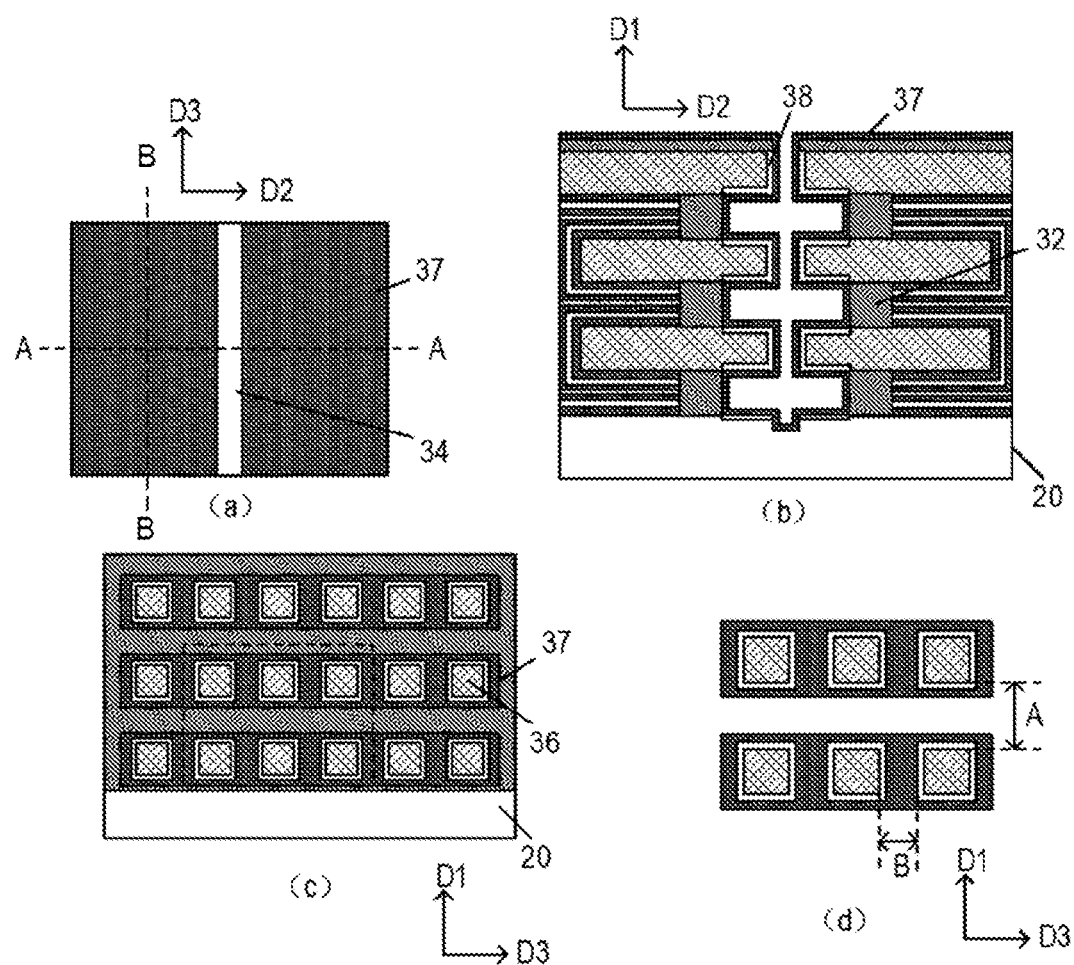
Figure 17:
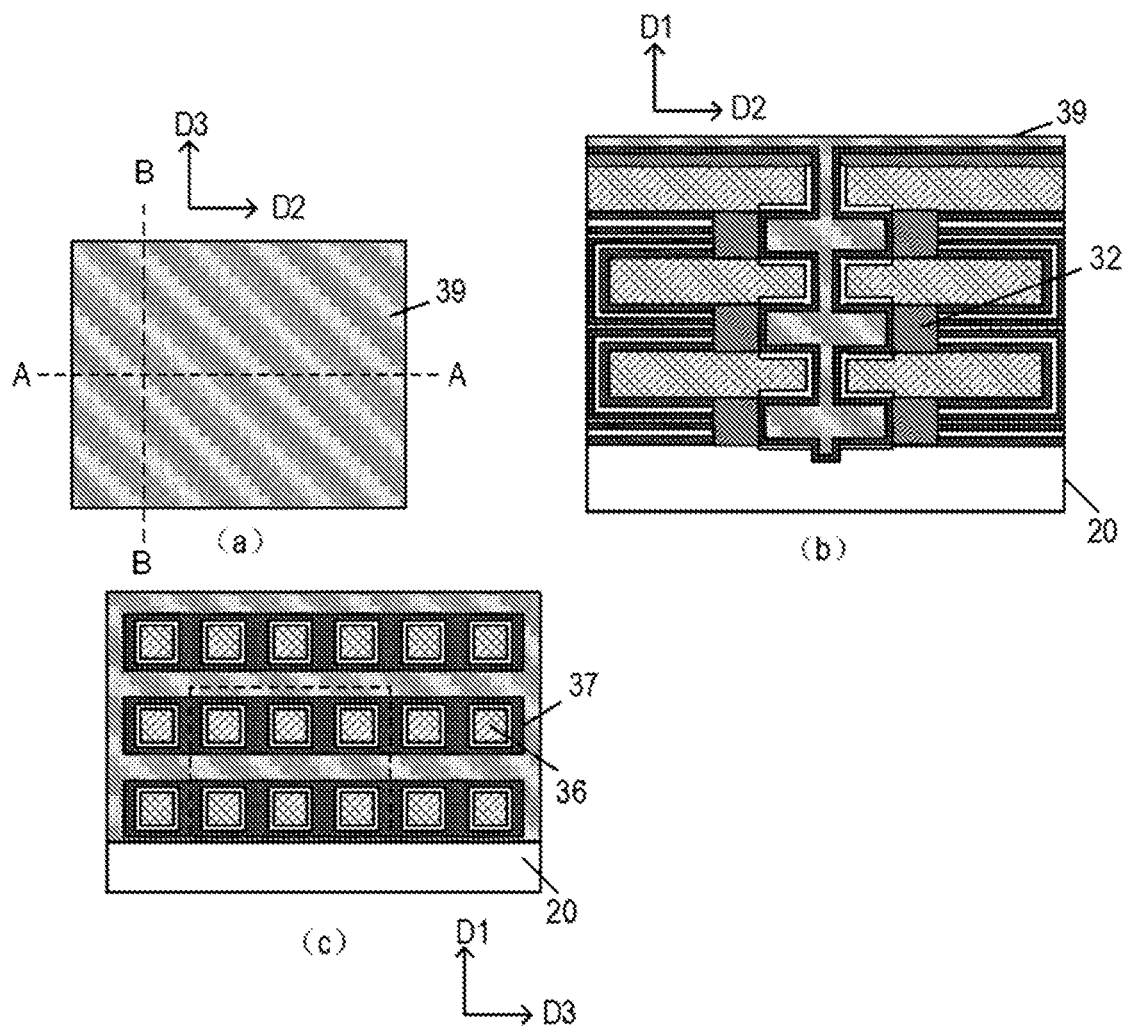

In some embodiments, the step of forming, in the second gap 35, the word line 40 that extends in the third direction D3 and continuously covers the channel regions arranged at intervals in the third direction D3 includes: forming an initial word line layer 37 that covers an inner wall of the second gap 35 and an inner wall of the second trench 34, where the initial word line layer 37 continuously covers at least the active columns 36 arranged at intervals in the third direction D3 as shown in FIG. 16, where image (a) of FIG. 16 is a schematic top view of a semiconductor structure, image (b) of FIG. 16 is a schematic cross-sectional diagram of image (a) of FIG. 16 along AA direction, image (c) of FIG. 16 is a schematic cross-sectional diagram of image (a) of FIG. 16 along BB direction, and image (d) of FIG. 16 is an enlarged schematic diagram of image (c) of FIG. 16 in a dashed-line frame; forming an isolation layer 39 that covers a surface of the initial word line layer 37 and fills the second gap 35 and the second trench 34 as shown in FIG. 17, where image (a) of FIG. 17 is a schematic top view of a semiconductor structure, image (b) of FIG. 17 is a schematic cross-sectional diagram of image (a) of FIG. 17 along AA direction, and image (c) of FIG. 17 is a schematic cross-sectional diagram of image (a) of FIG. 17 along BB direction; and removing the initial word line layer 37 and the isolation layer 39 that are located in the second trench 34 and above the source region and the drain region, to form a second opening between two adjacent drain regions and a third opening between two adjacent source regions, where the initial word line layer 37 remaining above the channel region is configured as the word line 40, and the isolation layer 39 remaining between two adjacent word lines 40 is configured as a word line isolation layer 41, as shown in FIG. 18.

In some embodiments, the step of forming an initial word line layer 37 that covers an inner wall of the second gap 35 and an inner wall of the second trench 34 includes: forming, by using a lateral atomic layer deposition process, the initial word line layer 37 that covers the inner wall of the second gap 35 and the inner wall of the second trench 34.

In some embodiments, after the second gap 35 is formed, a gate dielectric layer 38 covering a surface of the active column 36 may be formed through in-situ steam oxidation or by using a lateral deposition process, as shown in FIG. 16. Then, a conductive material such as metal tungsten or TiN is deposited on a surface of the gate dielectric layer 38 by using a lateral atomic layer deposition process, to form the initial word line layer 37 that covers the inner wall of the second gap 35 and the inner wall of the second trench 34. The lateral deposition process can ensure that the initial word line layer 37 fully covers the inner wall of the second gap 35, thereby further improving electrical performance of the semiconductor structure.

In some embodiments, the stacking layer 21 includes the semiconductor layer 212 and a first sacrificial layer 211 that are alternately stacked in the first direction D1, where the semiconductor columns 26 include an active column 36 located in the transistor region, and the active column 36 includes a channel region.

The thickness A of the first sacrificial layer 211 in the first direction D1 is four times greater than the width B of a gap between two adjacent channel regions in the semiconductor layer 212 in the third direction D3, that is, A>4B.

In some embodiments, the thickness A of the first sacrificial layer 211 in the first direction D1 is set to be four times greater than the width B of the gap between two adjacent channel regions in the semiconductor layer 212 in the third direction D3, so that when word line materials used to form the initial word line layer 37 are deposited, the word line materials are first connected in a line in the third direction D3, to ensure that the ultimately formed word line 40 extends in the third direction D3 and can fully and continuously covers the channel regions arranged at intervals in the semiconductor layer 212 in the third direction D3.

Figure 22:
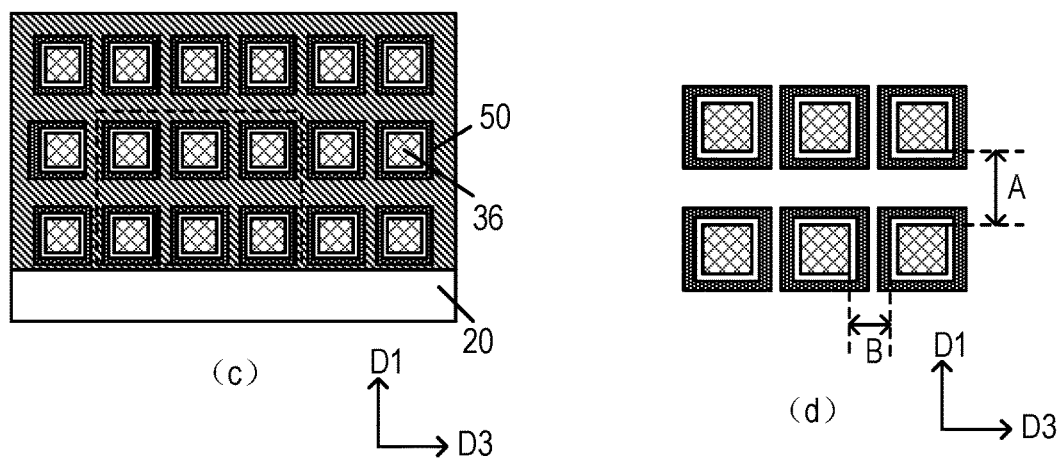
Figure 23:
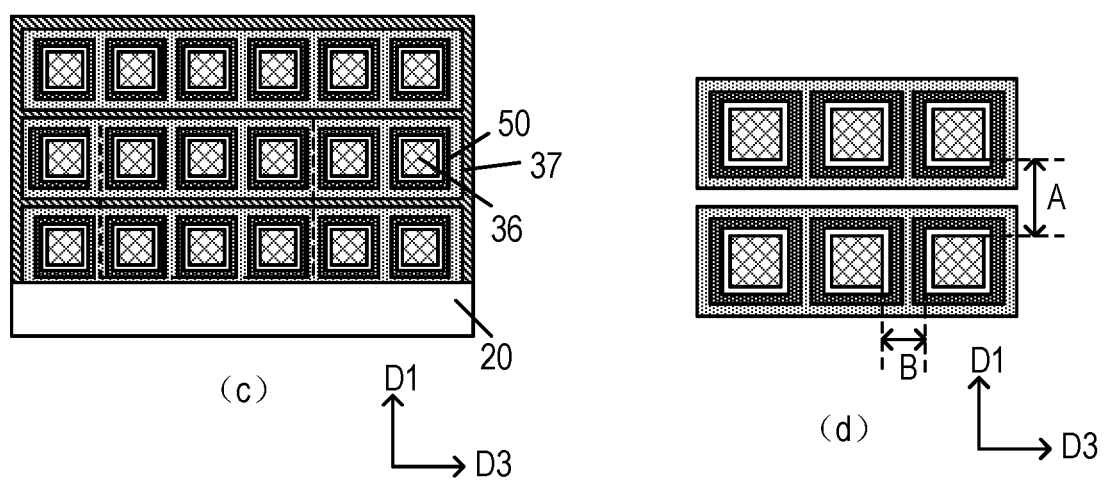

In some other embodiments, the step of forming, in the second gap 35, the word line 40 that extends in the third direction D3 and continuously covers the channel regions arranged at intervals in the third direction D3 includes: depositing a gate material on an inner wall of the second gap 35 and an inner wall of the second trench 34 along the second trench 34 to form an initial gate layer 50 that covers the active column 36, where two adjacent initial gate layers 50 in the third direction D3 are independent of each other as shown in FIG. 22, where image (c) of FIG. 22 is a schematic diagram of a cross-sectional structure, and image (d) of FIG. 22 is an enlarged schematic diagram of image (c) of FIG. 22 in a dashed-line frame; depositing an initial word line material along the second trench 34 to form an initial word line layer 37 that covers a surface of the initial gate layer 50, where the initial word line layer 37 continuously covers at least the active columns 36 arranged at intervals in the third direction D3 as shown in FIG. 23, where image (c) of FIG. 23 is a schematic diagram of a cross-sectional structure, and image (d) of FIG. 23 is an enlarged schematic diagram of image (c) of FIG. 23 in a dashed-line frame; forming an isolation layer that covers a surface of the initial word line layer 37 and fills the second gap 35 and the second trench 34; and removing the initial gate layer 50, the initial word line layer 37, and the isolation layer that are located in the second trench 34 and above the source region and the drain region, to form a second opening between two adjacent drain regions and a third opening between two adjacent source regions, where the initial gate layer 50 remaining above the channel region is configured as a gate layer, the initial word line layer 37 remaining above the gate layer and between two adjacent gate layers in the third direction D3 is configured as the word line, and the isolation layer remaining between two adjacent word lines is configured as a word line isolation layer.

In some embodiments, after the second trench 34 and the second gap 35 are formed, a gate dielectric layer covering a surface of the active column 36 may be formed through in-situ steam oxidation or by using a lateral deposition process. Then, a conductive material such as TiN is deposited on a surface of the gate dielectric layer by using a lateral atomic layer deposition process, to form the initial gate layer 50 located above the gate dielectric layer. A plurality of initial gate layers 50 are respectively located above a plurality of channel regions, and any two adjacent initial gate layers 50 are independent of each other. Afterwards, a conductive material such as metal tungsten is deposited on the surface of the initial gate layer 50 by using the lateral atomic layer deposition process, to form the initial word line layer 37 that continuously covers at least the active columns 36 arranged at intervals in the third direction D3. The initial gate layer 50 is first formed, so that in one aspect, it's further ensured that the subsequently formed initial word line layer 37 can fully and continuously cover the channel regions arranged at intervals in the third direction D3, and in another aspect, adhesion between the initial word line layer 37 and the initial gate layer 50 can be further enhanced.

Figure 21:
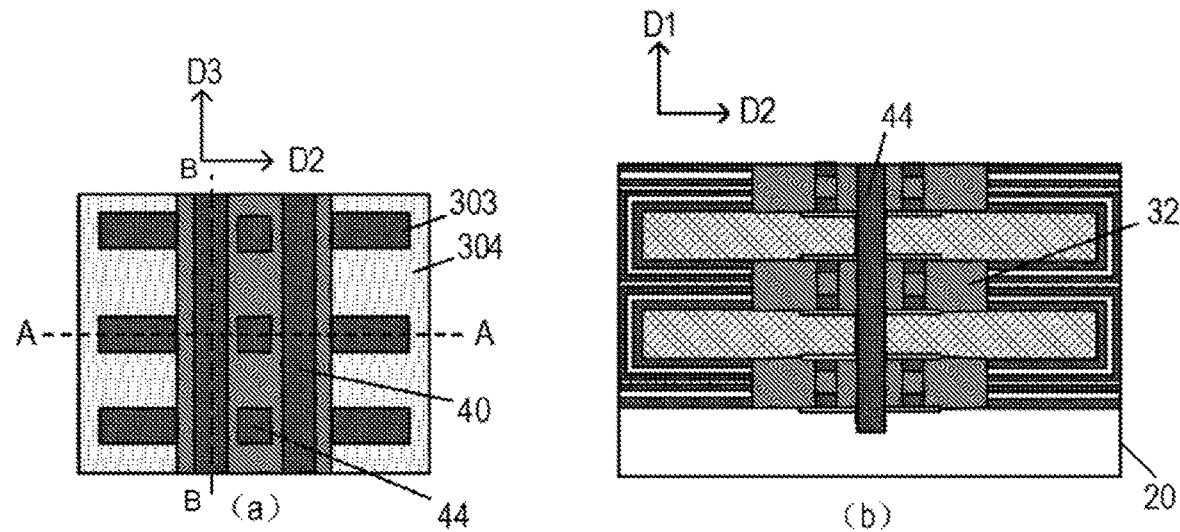

Step S14: Form a bit line 44 in the bit line region, where the bit line 44 extends in the first direction D1 and is electrically connected to the semiconductor columns 26 arranged at intervals in the first direction D1 as shown in FIG. 21, where image (a) of FIG. 21 is a schematic top view of a semiconductor structure, image (b) of FIG. 21 is a schematic cross-sectional diagram of image (a) of FIG. 21 along AA direction, and image (c) of FIG. 21 is a schematic cross-sectional diagram of image (a) of FIG. 21 along BB direction.

Figure 19:
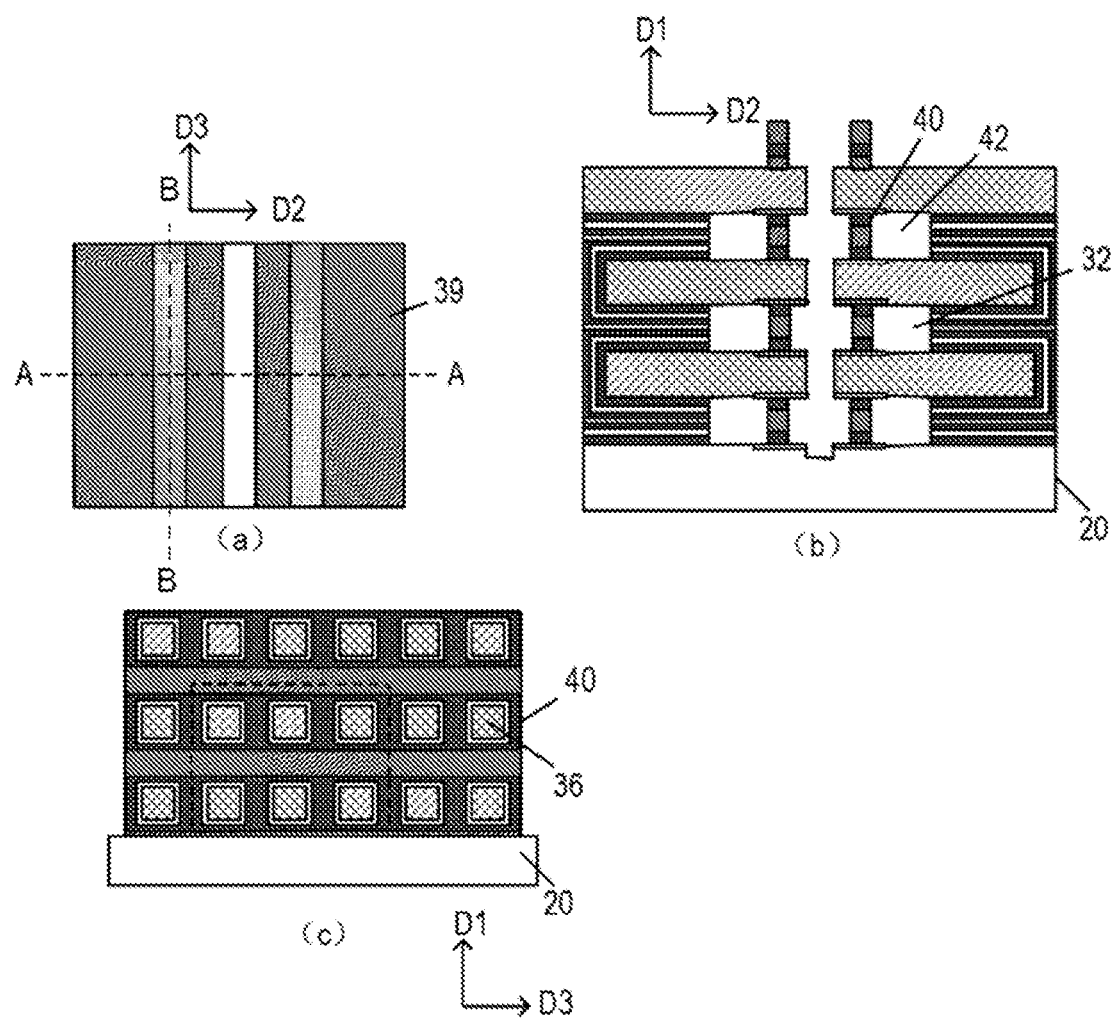
Figure 20:
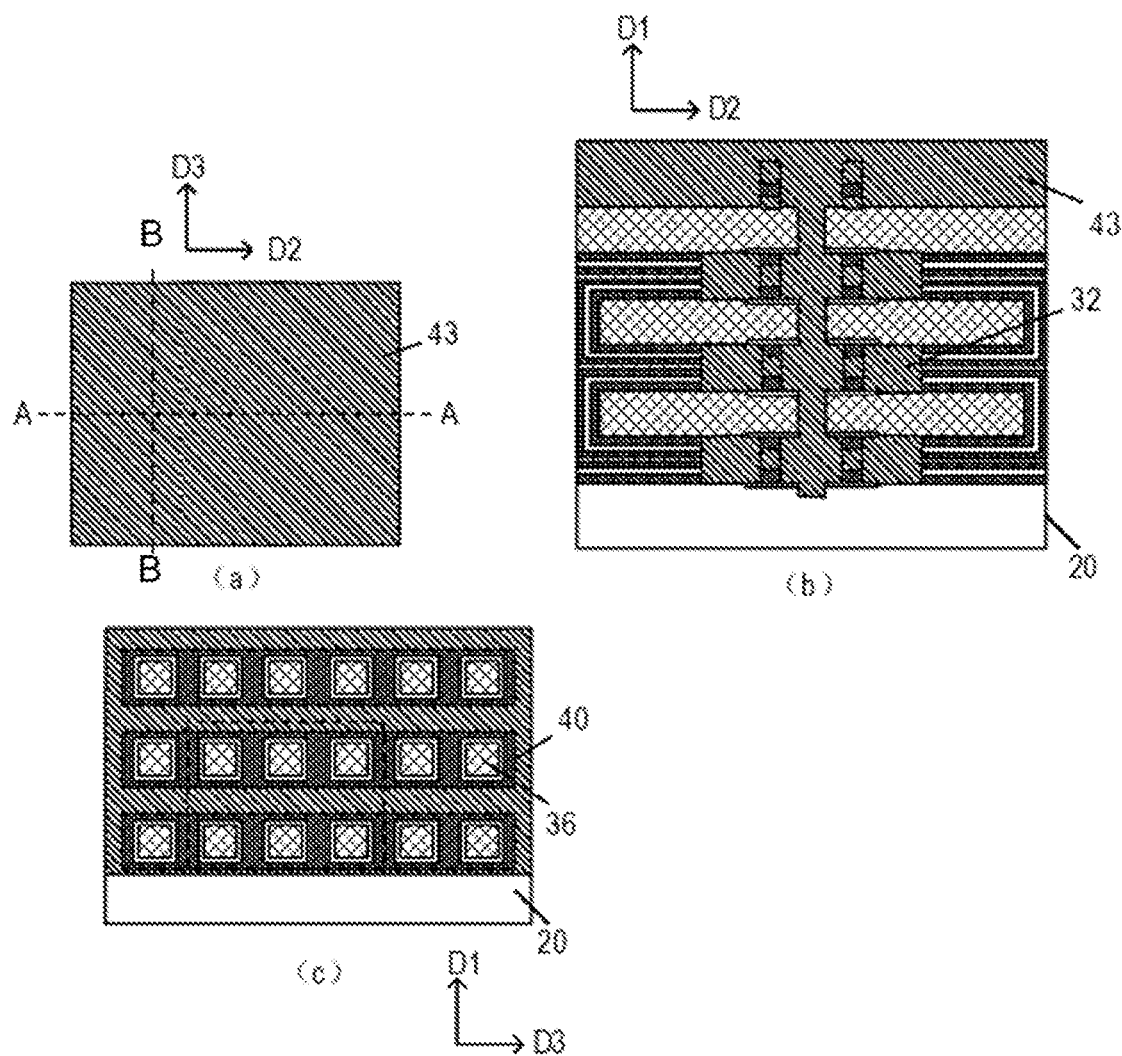

In some embodiments, before the bit line is formed in the bit line region, the method further includes the following steps: removing the capacitor isolation layer 32 as shown in FIG. 19, where image (a) of FIG. 19 is a schematic top view of a semiconductor structure, image (b) of FIG. 19 is a schematic cross-sectional diagram of image (a) of FIG. 19 along AA direction, and image (c) of FIG. 19 is a schematic cross-sectional diagram of image (a) of FIG. 19 along BB direction; forming a dielectric layer 43 that fills the first opening 31, the second opening, the third opening, and the second trench 34 as shown in FIG. 20, where image (a) of FIG. 20 is a schematic top view of a semiconductor structure, image (b) of FIG. 20 is a schematic cross-sectional diagram of image (a) of FIG. 20 along AA direction, and image (c) of FIG. 20 is a schematic cross-sectional diagram of image (a) of FIG. 20 along BB direction; and removing the dielectric layer 43 in the second trench 34.

In some embodiments, after the dielectric layer 43 in the second trench 34 is removed, a conductive material such as metal tungsten may be deposited in the second trench 34 to form the bit line 44 that extends in the first direction D1 and is electrically connected to the source region in the semiconductor columns 26 arranged at intervals in the first direction D1. One bit line 44 is electrically connected to two source regions located on two opposite sides of the bit line 44 in the second direction D2.

An embodiment further provides a semiconductor structure, and the semiconductor structure may be formed by using the method for forming a semiconductor structure described according to FIG. 1 to FIG. 23. A schematic diagram of the semiconductor structure provided in this embodiment may refer to FIG. 21.

According to the semiconductor structure and the method for forming the semiconductor structure provided in the embodiments, the stacking layer is formed on the top surface of the substrate, where the stacking layer includes a plurality of semiconductor layers arranged at intervals in a direction perpendicular to the top surface of the substrate, and each semiconductor layer includes a plurality of semiconductor columns arranged at intervals in a direction parallel to the top surface of the substrate, so that the plurality of semiconductor columns in the stacking layer are stacked in a three-dimensional array. Subsequently, a horizontal capacitor, a horizontal word line, and a vertical bit line are formed to convert a conventional two-dimensional semiconductor structure into a three-dimensional semiconductor structure. In this way, storage density of the semiconductor structure can be increased and performance of the semiconductor structure can be improved while integration of the semiconductor structure is improved. In addition, in the embodiments, two transistors can share one bit line, which further helps reduce the size of the semiconductor structure and improve the storage capacity of the semiconductor structure.

The foregoing descriptions are merely preferred embodiments of this invention. It should be noted that, for a person of ordinary skill in the art, improvements and ornaments may be made without departing from the principles of this invention. The improvements and ornaments also fall within the protection scope of this invention.

What is claimed is:

1. A method for forming a semiconductor structure, comprising:

forming a stacking layer on a top surface of a substrate, wherein the stacking layer comprises a plurality of semiconductor layers arranged at intervals in a first direction, and the stacking layer comprises a transistor region, two capacitor regions distributed on opposite sides of the transistor region in a second direction, and a bit line region, wherein the stacking layer comprises a plurality of semiconductor columns arranged at intervals in the first direction and a third direction, each semiconductor layer comprises the plurality of semiconductor columns arranged at intervals in the third direction, wherein the first direction is perpendicular to the top surface of the substrate, both of the second direction and the third direction are parallel to the top surface of the substrate, and the second direction intersects the third direction;

forming, in each capacitor region, a capacitor extending in the second direction;

forming a word line in the transistor region, wherein the word line extends in the third direction and continuously covers the plurality of semiconductor columns arranged at intervals in the third direction; and forming a bit line in the bit line region, wherein the bit line extends in the first direction and is electrically connected to the plurality of semiconductor columns arranged at intervals in the first direction, wherein the stacking layer comprises the plurality of semiconductor layers and a plurality of first sacrificial layers that are alternately stacked in the first direction, wherein each semiconductor column comprises an active column located in the transistor region, and the active column comprises a channel region, and wherein a thickness of each first sacrificial layer in the first direction is four times greater than a width of a gap between two adjacent channel regions in each semiconductor layer in the third direction.

2. The method for forming a semiconductor structure according to claim 1, wherein the step of forming a stacking layer on a top surface of a substrate comprises:

alternately depositing the plurality of semiconductor layers and the plurality of first sacrificial layers on the top surface of the substrate in the first direction to form the stacking layer; and etching the stacking layer to form a first trench exposing the substrate, wherein the first trench separates each semiconductor layer into the plurality of semiconductor columns arranged at intervals in the third direction.

3. The method for forming a semiconductor structure according to claim 2, wherein each semiconductor column comprises a conductive column located in each capacitor region, and the step of forming, in each capacitor region, a capacitor extending in the second direction comprises:

removing the first sacrificial layer in each capacitor region to form a first gap between two adjacent semiconductor layers in each capacitor region;

forming, in the first gap, a conductive layer covering the conductive column, a dielectric layer covering the conductive layer, an upper electrode layer covering the dielectric layer, and a common electrode layer covering the upper electrode layer; and forming a capacitor comprising the conductive column, the conductive layer, the dielectric layer, the upper electrode layer, and the common electrode layer.

4. The method for forming a semiconductor structure according to claim 3, wherein the step of forming a capacitor comprising the conductive column, the conductive layer, the dielectric layer, the upper electrode layer, and the common electrode layer comprises:

forming a conductive layer that continuously covers inner walls of the first gaps arranged at intervals in the first direction;

forming a dielectric layer covering a surface of the conductive layer;

forming an upper electrode layer covering a surface of the dielectric layer;

forming a common electrode layer covering a surface of the upper electrode layer;

removing the conductive layer, the dielectric layer, the upper electrode layer, and the common electrode layer that cover a sidewall of the first sacrificial layer in the transistor region; and forming a first opening between two adjacent semiconductor layers in each capacitor region, wherein the conductive column, and the conductive layer, the dielectric layer, the upper electrode layer, and the common electrode layer that remain in the first gap form the capacitor.

5. The method for forming a semiconductor structure according to claim 4, wherein each semiconductor column comprises an active column located in the transistor region, the active column comprises a channel region, and a source region and a drain region distributed on opposite sides of the channel region in the second direction, the drain region is adjacent to each capacitor region, the source region is adjacent to the bit line region, and wherein the step of forming a word line in the transistor region comprises:

removing the first sacrificial layer in the transistor region and the stacking layer in the bit line region;

forming a second gap exposing at least the channel region in the transistor region and a second trench exposing the substrate in the bit line region; and forming, in the second gap, the word line that extends in the third direction and continuously covers the channel regions arranged at intervals in the third direction.

6. The method for forming a semiconductor structure according to claim 5, wherein the step of forming a second gap exposing at least the channel region in the transistor region and a second trench exposing the substrate in the bit line region comprises:

forming a capacitor isolation layer filling the first opening;

removing the stacking layer in the bit line region to form the second trench exposing the substrate in the bit line region; and removing the first sacrificial layer in the transistor region along the second trench to form, between two adjacent semiconductor layers in the transistor region, the second gap exposing the channel region, the drain region, and the source region.

7. The method for forming a semiconductor structure according to claim 5, wherein a bottom of the second trench exposes the top surface of the substrate; or the second trench extends to an inside of the substrate.

8. The method for forming a semiconductor structure according to claim 6, wherein the stacking layer comprises two transistor subregions distributed on opposite sides of the bit line region in the second direction, and one capacitor subregion is located on a side of the transistor region that is away from the bit line region, and wherein the step of removing the first sacrificial layer in the transistor region along the second trench comprises:

simultaneously removing the first sacrificial layers in the two transistor subregions along the second trench.

9. The method for forming a semiconductor structure according to claim 6, wherein the step of forming, in the second gap, the word line that extends in the third direction and continuously covers the channel regions arranged at intervals in the third direction comprises:

forming an initial word line layer that covers an inner wall of the second gap and an inner wall of the second trench, wherein the initial word line layer continuously covers at least the active columns arranged at intervals in the third direction;

forming an isolation layer that covers a surface of the initial word line layer and fills the second gap and the second trench; and removing the initial word line layer and the isolation layer that are located in the second trench and above the source region and the drain region, to form a second opening between two adjacent drain regions and a third opening between two adjacent source regions, wherein the initial word line layer remaining above the channel region is configured as the word line, and the isolation layer remaining between two adjacent word lines is configured as a word line isolation layer.

10. The method for forming a semiconductor structure according to claim 9, wherein the step of forming an initial word line layer that covers an inner wall of the second gap and an inner wall of the second trench comprises:

forming, by using a lateral atomic layer deposition process, the initial word line layer that covers the inner wall of the second gap and the inner wall of the second trench.

11. The method for forming a semiconductor structure according to claim 9, before forming the bit line in the bit line region, further comprising:
removing the capacitor isolation layer;
forming a dielectric layer that fills the first opening, the second opening, the third opening, and the second trench; and
removing the dielectric layer in the second trench.

12. The method for forming a semiconductor structure according to claim 6, wherein the step of forming, in the second gap, the word line that extends in the third direction and continuously covers the channel regions arranged at intervals in the third direction comprises:
depositing a gate material on an inner wall of the second gap and an inner wall of the second trench along the second trench to form an initial gate layer that covers the active column, wherein two adjacent initial gate layers in the third direction are independent of each other;
depositing an initial word line material along the second trench to form an initial word line layer that covers a surface of the initial gate layer, wherein the initial word line layer continuously covers at least the active columns arranged at intervals in the third direction;
forming an isolation layer that covers a surface of the initial word line layer and fills the second gap and the second trench; and
removing the initial gate layer, the initial word line layer, and the isolation layer that are located in the second trench and above the source region and the drain region, to form a second opening between two adjacent drain regions and a third opening between two adjacent source regions, wherein the initial gate layer remaining above the channel region is configured as a gate layer, the initial word line layer remaining above the gate layer and between two adjacent gate layers in the third direction is configured as the word line, and the isolation layer remaining between two adjacent word lines is configured as a word line isolation layer.

13. The method for forming a semiconductor structure according to claim 1, wherein a material of the semiconductor layer is a silicon material doped with ions.

14. The method for forming a semiconductor structure according to claim 1, wherein the semiconductor structure is a dynamic random access memory.

15. A semiconductor structure, wherein the semiconductor structure is formed by using the method according to claim 1.

16. The semiconductor structure according to claim 15, wherein the semiconductor structure is a dynamic random access memory.

* * * * *